US012777792B2

(12) United States Patent
Kwak

(10) Patent No.: US 12,777,792 B2
(45) Date of Patent: Oct. 27, 2026

(54) LIGHT EMITTING DISPLAY DEVICE INCLUDING AN INTERLEAVED CHARGE GENERATION LAYER OVER A CONNECTION ELECTRODE

(71) Applicant: LG Display Co., Ltd., Seoul (KR)

(72) Inventor: Jae Young Kwak, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 438 days.

(21) Appl. No.: 18/376,560

(22) Filed: Oct. 4, 2023

(65) Prior Publication Data

US 2024/0260348 A1 Aug. 1, 2024

(30) Foreign Application Priority Data

Jan. 30, 2023 (KR) ........................ 10-2023-0012202

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .. H10K 59/131; H10K 59/1201; H10K 50/19; H10K 50/30; H10K 71/00; H10H 29/10
See application file for complete search history.

(56) References Cited

U.S. PATENT DOCUMENTS

2020/0066815 A1 2/2020 Choi et al.
2021/0384283 A1* 12/2021 Jung .................... H10K 59/131

FOREIGN PATENT DOCUMENTS

CN 115440905 A * 12/2022
CN 115498120 A * 12/2022
JP 6823735 B2 2/2021
KR 20170042415 A * 4/2017 .......... H01L 27/3211

OTHER PUBLICATIONS

GB Combined Search and Examination Report dated May 3, 2024 issued in Patent Application No. GB2316818.0 (7 pages).

* cited by examiner

*Primary Examiner* — Davienne N Monbleau
*Assistant Examiner* — Emily Farmer
(74) *Attorney, Agent, or Firm* — Fish & Richardson P.C.

(57) ABSTRACT

A light emitting display device according to an aspect of the present disclosure includes a substrate including a display area including a plurality of sub-pixels and a non-display area, a plurality of first electrodes respectively provided in the plurality of sub-pixels, a second electrode facing the plurality of first electrodes and extending over the entire display area and a part of the non-display area, an interlayer including a plurality of stacks provided between the plurality of first electrodes and the second electrode and a charge generation layer between the plurality of stacks, and a connection electrode connected to the charge generation layer. The charge generation layer includes an n-type charge generation layer and a p-type charge generation layer, and the n-type charge generation layer includes a first connection part connected to the connection electrode and the p-type charge generation layer includes a second connection part connected to the connection electrode.

14 Claims, 12 Drawing Sheets

LIGHT EMITTING DISPLAY DEVICE INCLUDING AN INTERLEAVED CHARGE GENERATION LAYER OVER A CONNECTION ELECTRODE

CROSS-REFERENCE TO RELATED APPLICATIONS

This application claims the benefit of Korean Patent Application No. 10-2023-0012202, filed on Jan. 30, 2023, which is hereby incorporated by reference as if fully set forth herein.

TECHNICAL FIELD

The present disclosure relates to a display device, and more particularly, to a light emitting display device capable of stabilizing the potential of a common layer by including a connection electrode corresponding to a charge generation layer, to which a reset voltage is applied, thereby preventing lateral leakage current caused by the common layer.

BACKGROUND

With the development of the information society, demand for display devices for displaying images in various forms is increasing.

A light emitting display device in which pixels are composed of light emitting elements does not require a separate light source and thus is advantageous in achieving a slim or flexible configuration and has a high color purity.

The light emitting display device may include a plurality of common layers together with an emission layer to increase light emission efficiency.

Since the plurality of common layers is commonly provided in sub-pixels and includes a material with high mobility, lateral leakage current may be generated.

When lateral leakage current is generated, a turned-off sub-pixel that is adjacent to a turned-on sub-pixel may receive a voltage to the turned-on sub-pixel, causing the turned-off sub-pixel to operate and emitting light (e.g., light leakage).

SUMMARY

Accordingly, the present disclosure is directed to a light emitting display device that substantially obviates one or more problems due to limitations and disadvantages of the related art.

The present disclosure devised to solve the above-described problems provides a light emitting display device that prevents lateral leakage current between adjacent sub-pixels. In aspects of the disclosure, a connection electrode connected to a charge generation layer having high mobility and resetting the potential of the charge generation layer having high mobility through the connection electrode may prevent the leakage current.

In addition, the light emitting display device of the present disclosure includes connection parts where an n-type charge generation layer and a p-type charge generation layer constituting the charge generation layer are connected to the connection electrode (line), and thus may have paths through which leakage current is discharged from the charge generation layers of different polarities. Therefore, it is possible to prevent charges from remaining in the upper layer in the stack structure of charge generation layers and affecting lateral leakage current.

The present disclosure proposes a light emitting display device having a structure capable of preventing leakage current caused by a charge generation layer.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a light emitting display device includes a substrate including a display area including a plurality of sub-pixels and a non-display area surrounding the display area, a plurality of first electrodes respectively provided in the plurality of sub-pixels, a second electrode facing the plurality of first electrodes and extending over the entire display area and a part of the non-display area, an interlayer including a plurality of stacks provided between the plurality of first electrodes and the second electrode and a charge generation layer between the plurality of stacks, and a connection electrode connected to the charge generation layer. The charge generation layer may include an n-type charge generation layer and a p-type charge generation layer, and the n-type charge generation layer and the p-type charge generation layer may have a first connection part and a second connection part for connection with the connection electrode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure. In the drawings.

DETAILED DESCRIPTION

Figure 1:
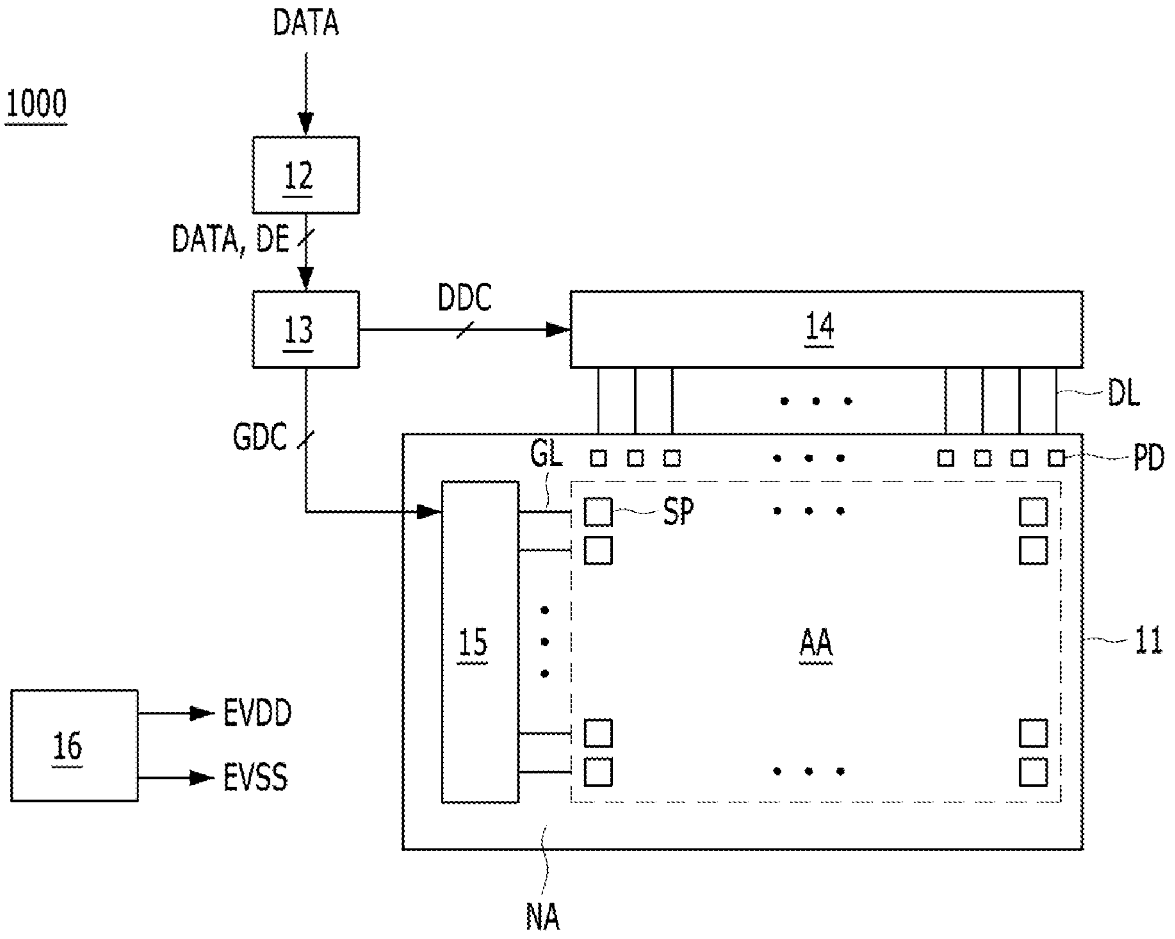
FIG. 1 is a schematic block diagram of a light emitting display device according to the present disclosure.

Reference will now be made in detail to the preferred aspects of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clear description of the specification and may differ from the names of elements of actual products.

The shape, size, ratio, angle, number, and the like shown in the drawings to illustrate various aspects of the present disclosure are merely provided for illustration, and are not limited to the content shown in the drawings. Wherever possible, the same reference numbers will be used throughout the drawings to refer to the same or like parts. In the following description, detailed descriptions of technologies or configurations related to the present disclosure may be omitted to avoid unnecessarily obscuring the subject matter of the present disclosure. When terms such as "including", "having", and "comprising" are used throughout the specification, an additional component may be present, unless "only" is used. A component described in a singular form encompasses a plurality thereof unless particularly stated otherwise.

The components included in the aspects of the present disclosure should be interpreted to include an error range, even if there is no additional particular description thereof.

In describing a variety of aspects of the present disclosure, when terms for positional relationships such as "on", "above", "under" and "next to" are used, at least one intervening element may be present between two elements, unless "immediately" or "directly" is used.

In describing a variety of aspects of the present disclosure, when terms related to temporal relationships, such as "after", "subsequently", "next" and "before", are used, the non-continuous case may be included, unless "immediately" or "directly" is used.

In describing a variety of aspects of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

Features of various aspects of the present disclosure may be partially or completely coupled to or combined with each other, and may be variously inter-operated with each other and driven technically. The aspects of the present disclosure may be carried out independently from each other, or may be carried out together in an interrelated manner.

Hereinafter, a light emitting display device of the present disclosure will be described with reference to the drawings.

FIG. 1 is a schematic block diagram of a light emitting display device according to an aspect of the present disclosure.

As illustrated in FIG. 1, the light emitting display device 1000 according to an aspect of the present disclosure may include a display panel 11, an image processor 12, a timing controller 13, a data driver 14, a scan driver 15, and a power supply 16.

The display panel 11 may display an image in response to a data signal DATA supplied from the data driver 14, a scan signal supplied from the scan driver 15, and power supplied from the power supply 16.

The display panel 11 may include sub-pixels SP disposed at intersections of a plurality of gate lines GL and a plurality of data lines DL. The structure of the sub-pixels SP may be changed in various manners according to the type of the light emitting display device 1000.

For example, the sub-pixels SP may be formed in a top emission structure, a bottom emission structure, or a dual emission structure. The sub-pixels SP refer to units capable of emitting lights of respective colors with or without a specific type of color filter. For example, the sub-pixels SP may include a red sub-pixel, a green sub-pixel, and a blue sub-pixel. Alternatively, the sub-pixels SP may include, for example, a red sub-pixel, a blue sub-pixel, a white sub-pixel, and a green sub-pixel. The sub-pixels SP may have one or more different emission areas according to light emitting characteristics. For example, a blue sub-pixel and sub-pixels emitting different colors may have different emission areas.

One or more sub-pixels SP may constitute one unit pixel. For example, one unit pixel may include red, green, and blue sub-pixels, and the red, green, and blue sub-pixels may be repeatedly disposed. Alternatively, one unit pixel may include red, green, blue, and white sub-pixels, and the red, green, blue, and white sub-pixels may be repeatedly arranged or may be disposed in a quad type (e.g., a two dimensional grid). In an aspect according to the present disclosure, the sub-pixels may have various color types, arrangement types, and arrangement orders according to light emitting characteristics, device lifespan, and device specifications, but the present disclosure is not limited thereto.

The display panel 11 may be divided into a display area AA including sub-pixels SP configured to emit light and display an image, and a non-display area NA around the display area AA. The scan driver 15 may be provided in the non-display area NA of the display panel 11. In addition, the non-display area NA may include a pad portion PAD including pad electrodes PD.

The image processor 12 may output a data enable signal DE and the like along with an externally supplied data signal DATA. In some aspects, the image processor 12 may output one or more of a vertical synchronization signal, a horizontal synchronization signal, and a clock signal in addition to the data enable signal DE, but illustration of these signals is omitted for convenience of description.

The timing controller 13 may receive the data signal DATA and driving signals from the image processor 12. The driving signals may include the data enable signal DE. Alternatively or additionally, the driving signals may include the vertical synchronization signal, the horizontal synchronization signal, and the clock signal. The timing controller 13 may output a data timing control signal DDC for controlling operation timing of the data driver 14 and a gate timing control signal GDC for controlling operation timing of the scan driver 15 based on the driving signals.

The data driver 14 may sample and latch the data signal DATA supplied from the timing controller 13 in response to the data timing control signal DDC, convert the data signal DATA into a gamma reference voltage, and output the gamma reference voltage.

The data driver 14 may output the data signal DATA through the data lines DL. The data driver 14 may be implemented in the form of an integrated circuit (IC). For example, the data driver 14 may be electrically connected to the pad electrodes PD that are disposed in the non-display area NA of the display panel 11 through a flexible circuit film (not shown).

The scan driver 15 may output a scan signal in response to the gate timing control signal GDC from the timing controller 13. The scan driver 15 may output the scan signal through the gate lines GL. The scan driver 15 may be implemented in the form of an IC or implemented in the display panel 11 in a gate-in-panel (GIP) structure.

The power supply 16 may output a high-potential voltage and a low-potential voltage for driving the display panel 11. The power supply 16 may supply the high-potential voltage to the display panel 11 through a first power line EVDD (driving power line or pixel power line) and may supply the low-potential voltage to the display panel 11 through a second power line EVSS (auxiliary power line or common power line).

The display panel 11 is divided into the display area AA and the non-display area NA and may include a plurality of sub-pixels SP defined by gate lines GL and data lines DL intersecting each other in a matrix form in the display area AA.

The sub-pixels SP may include sub-pixels emitting at least two of red light, green light, blue light, yellow light, magenta light, and cyan light. In addition, the plurality of sub-pixels SP may emit respective colors with or without a specific type of color filter. However, the present disclosure is not necessarily limited thereto, and the sub-pixels SP may have various color types, arrangement types, and arrangement orders according to light emitting characteristics, device lifespan, and device specifications, etc.

Hereinafter, light emitting display devices according to aspects of the present disclosure will be described.

Figure 2:
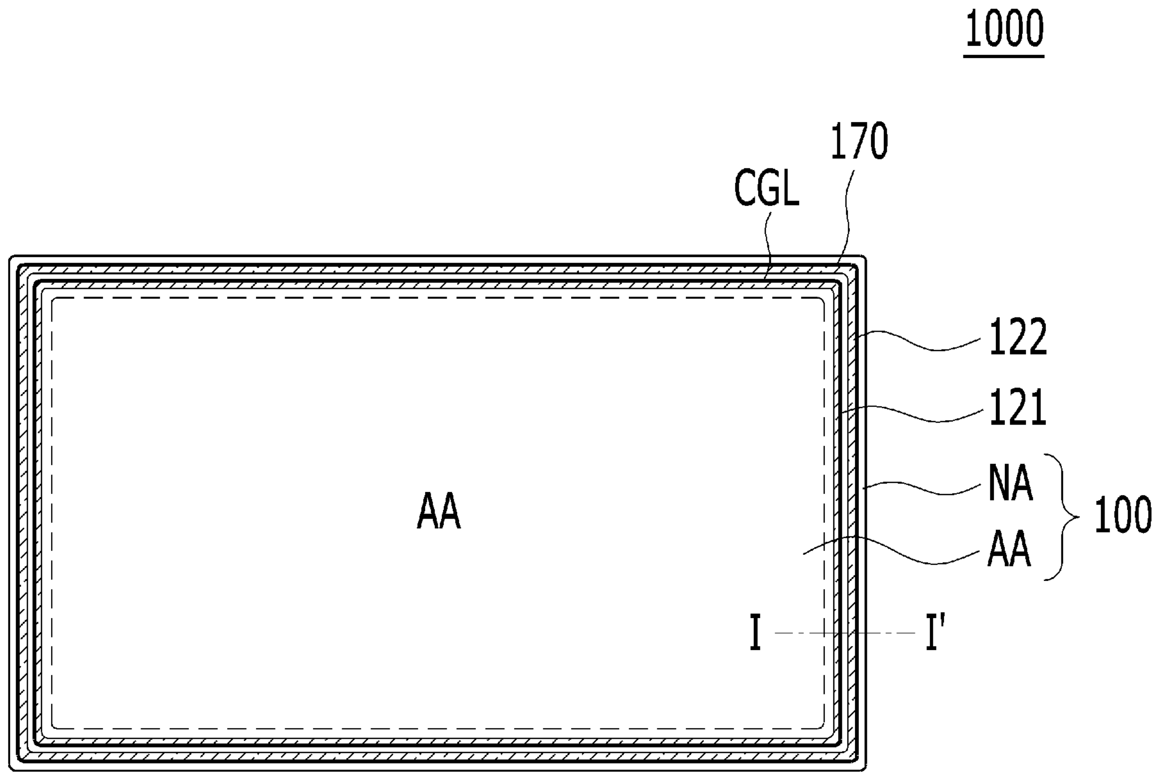
FIG. 2 is a plan view illustrating a connection line and a second power line in a light emitting display device according to an aspect of the present disclosure.
Figure 3:
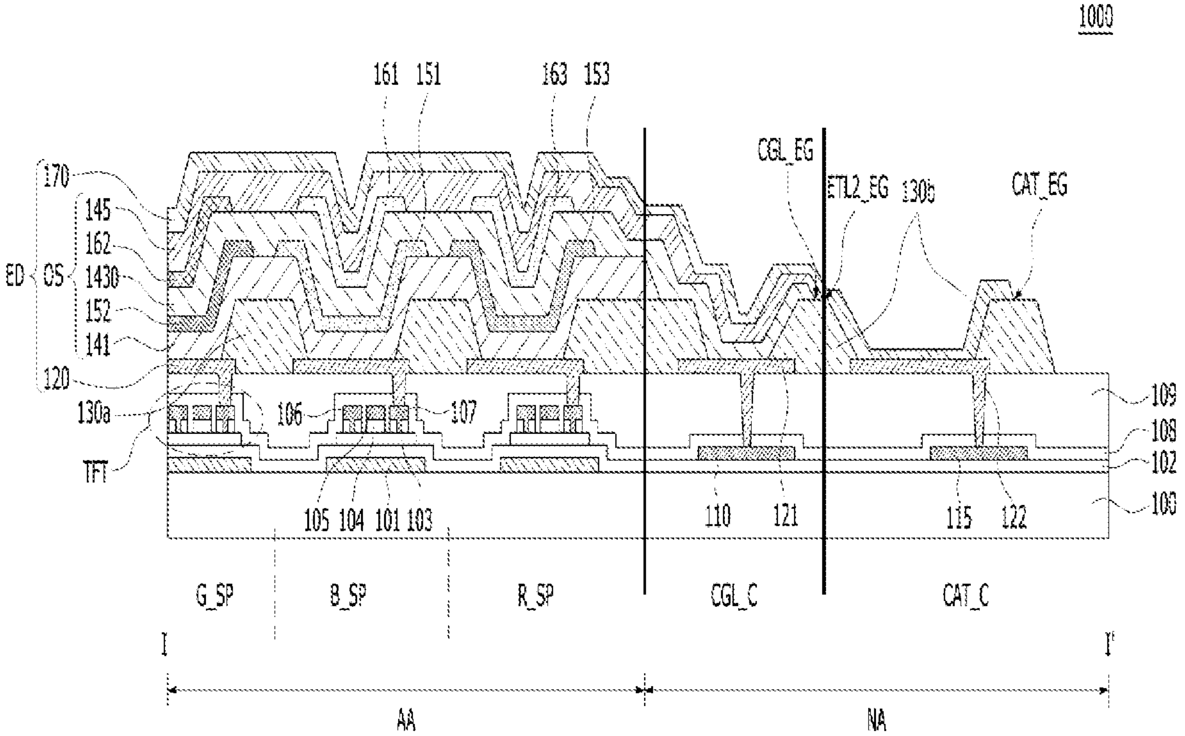
FIG. 3 is a cross-sectional view taken along line I-I' of FIG. 2.
Figure 4A:
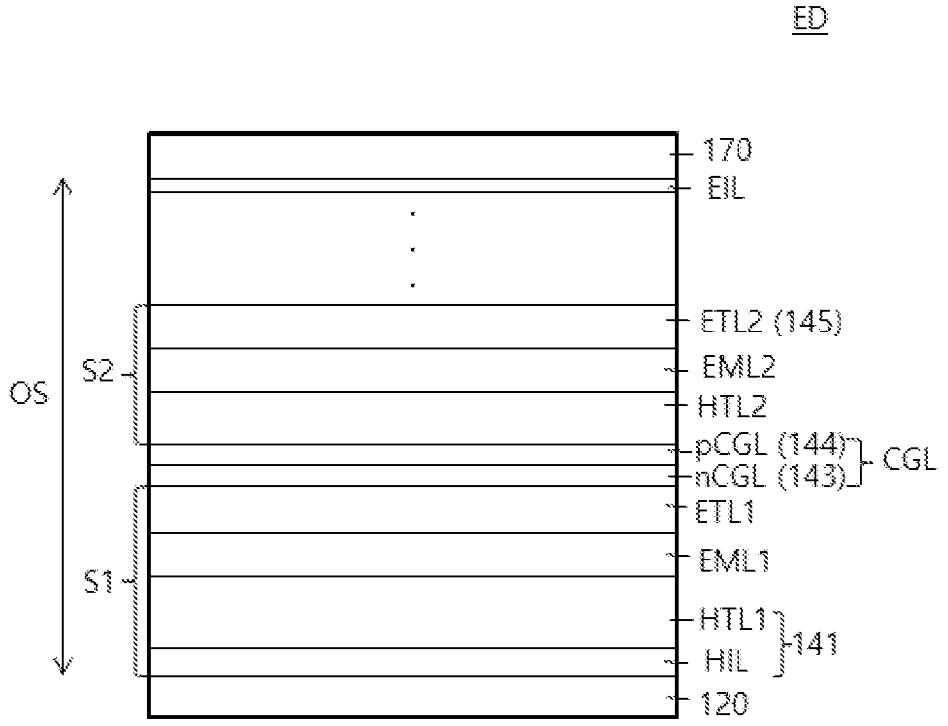
FIGS. 4A to 4C are cross-sectional views illustrating a sub-pixel area, a charge generation layer connection area, and a second electrode connection area of FIG. 3 in the light emitting display device according to an aspect of the present disclosure.
Figure 4B:
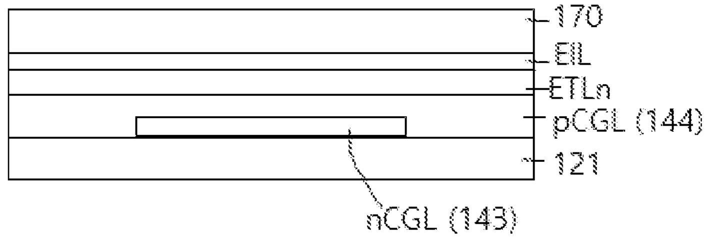
Figure 4C:
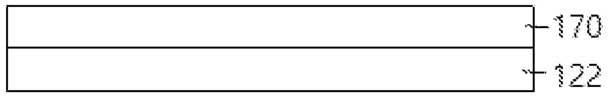

FIG. 2 is a plan view illustrating a connection line and a second power line in a light emitting display device according to an aspect of the present disclosure. FIG. 3 is a cross-sectional view taken along line I-I' of FIG. 2. FIGS. 4A to 4C are cross-sectional views illustrating a sub-pixel area, a charge generation layer connection area, and a second electrode connection area of FIG. 3.

As illustrated in FIGS. 2 and 3, the light emitting display device 1000 according to an aspect of the present disclosure includes a substrate 100 including a display area AA in which a plurality of sub-pixels G_SP, B_SP, and R_SP is disposed and a non-display area NA surrounding the display area AA, a plurality of first electrodes 120 respectively provided in the plurality of sub-pixels G_SP, B_SP, and R_SP, a second electrode 170 facing the plurality of first electrodes 120 and extending over the entire display area AA and a part of the non-display area NA, an interlayer OS provided between the plurality of first electrodes 120 and the second electrode 170, a second connection electrode 122 provided at the non-display area NA and connected to the second electrode 170, and a first connection electrode 121 provided inside the second connection electrode 122 and connected to a charge generation layer CGL.

Each of the sub-pixels G_SP, B_SP, and R_SP includes a light emitting element ED formed by laminating the first electrode 120, the interlayer OS, and the second electrode 170, as illustrated in FIG. 4A.

In some aspects, the interlayer OS includes a plurality of stacks S1, S2, . . . SN, and a charge generation layer CGL provided between adjacent stacks, as illustrated in FIG. 4A. For example, if n stacks (where n is a natural number equal to or greater than 2) are provided, n−1 charge generation layers CGLs may be provided between two adjacent stacks (e.g., stack S1 and stack S2, stack S2 and stack S3, etc.).

In addition, the charge generation layer CGL may include an n-type charge generation layer nCGL 143 for generating electrons and supplying the electrons to an adjacent lower stack and a p-type charge generation layer pCGL 144 for generating holes and supplying the holes to an adjacent upper stack.

The n-type charge generation layer nCGL 143 may further include metal ions provided by an n-type dopant to supply electrons in a vertical direction along with a host. Non-limiting examples of metal ions may include alkali metals such as lithium (Li), alkaline earth metals such as calcium (Ca) and strontium (Sr), or lanthanides such as ytterbium (Yb).

In addition, the p-type charge generation layer pCGL 144 may include a p-type dopant to supply holes to the upper stack along with a host of the same type or a different type as the n-type charge generation layer nCGL 143. The p-type dopant may be an organic dopant or an inorganic dopant including a metal or the like.

However, the n-type dopant or the p-type dopant has high electrical mobility in the horizontal direction as well as in the vertical direction. In this case, if the charge generation layer is commonly formed in the display area AA, a leakage current may be generated between adjacent sub-pixels through the charge generation layer. The leakage current can cause an adjacent pixel, which is intended to be turned off, to turn, which becomes a problem. In some aspects, to prevent leakage current caused by at least the charge generation layer, the charge generation layer CGL is connected to the first connection electrode 121, and a reset voltage signal is received from the first connection electrode 121 and a first power line 110 to discharge leaked charges accumulated at the node of the charge generation layer CGL, as illustrated in FIGS. 3 and 4B.

A light emitting element ED formed by laminating the first electrode 120, the interlayer OS, and the second electrode 170 is formed in each of the sub-pixels G_SP, B_SP, and R_SP in the display area AA. In some aspects, the first electrode 120 may be divided for each of the sub-pixels G_SP, B_SP, and R_SP, and the second electrode 170 may be continuously formed over the plurality of sub-pixels G_SP, B_SP, and R_SP provided in the display area AA.

As illustrated in FIG. 3, in the light emitting element ED, the interlayer OS may include a hole injection and transport layer 141, first emission layers 151, 152, and 153, a charge transport and generation layer 1430, second emission layers 161, 162, and 163, and an electron transport and injection layer 145.

The hole injection and transport layer 141, the charge transport and generation layer 1430, and the electron transport and injection layer 145 may be formed without being disconnected in at least the display area AA, and portions thereof may extend to the non-display area NA, and may be referred to as common layers that are commonly formed in the display area AA. The hole injection and transport layer 141, the charge transport and generation layer 1430, and the electron transport and injection layer 145 may be formed using, for example, an open mask. Although the first emission layers 152, 151, and 153 are formed separately for respective sub-pixels in FIG. 3, the first emission layers 151, 152, and 153 may also be formed of the same material using an open mask without emitting colors distinguished for respective sub-pixels and without being divided for the respective sub-pixels like the hole injection and transport layer 141. The second emission layers 161, 162, and 163 may also be formed without being divided for the respective sub-pixels. In this case, the first emission layers 151, 152, and 153 and the second emission layers 161, 162, and 163 are formed without being divided for the respective sub-pixels may include emission layers emitting the same color or emission layers emitting different colors. In addition, each of the hole injection and transport layer 141, the charge transport and generation layer 1430, and the electron transport and injection layer 145 may include a plurality of layers.

FIG. 4A illustrates a structure of the light emitting element ED of each sub-pixel, in which the first stack S1, the charge generation layer CGL, and the second stack S2 are sequentially stacked on the first electrode 120 to form the interlayer OS. If the interlayer OS includes three or more stacks, one or more sets each including a charge generation layer and an additional stack may be further provided on the second stack S2.

The first stack S1 includes a hole injection layer HIL, a first hole transport layer HTL1, a first emission layer EML1, and a first electron transport layer ETL1. The second stack S2 on the charge generation layer CGL may include a second hole transport layer HTL2, a second emission layer EML2, and a second electron transport layer ETL2.

In some cases, common layers may be classified into based on different properties. For example, a hole transport common layer and an electron transport common layer, depending on whether the layers are located on or below an emission layer and whether the layers are located between stacks, serve as a charge generation layer.

For example, as illustrated in FIG. 3, when the interlayer OS is disposed between the first electrode 120 and second electrode 170 having a two-stack structure, the hole injection and transport layer 141, the charge transport and generation layer 1430, and the electron transport and injection layer 145 may be classified as follows.

The hole injection and transport layer 141 may include, for example, the hole injection layer HIL and the first hole transport layer HTL1, as illustrated in FIG. 4A. The hole injection and transport layer 141 is located below the first emission layer EML1 (151, 152, and 153) and is commonly provided in the display area AA in terms of hole injection and generation.

The charge transport and generation layer 1430 may include the first electron transport layer ETL1, the charge generation layer CGL, and the second hole transport layer HTL2.

In addition, the charge generation layer CGL may be formed by laminating the n-type charge generation layer nCGL 143 and the p-type charge generation layer pCGL.

In some aspects, the charge generation layer CGL among the first electron transport layer ETL1, the charge generation layer CGL, and the second hole transport layer HTL2 forming the charge transport and n-type charge generation layer 143 illustrated in FIG. 3 may be directly connected to the first connection electrode 121 to reduce connection resistance. In this case, the first electron transport layer ETL1 and the second hole transport layer HTL2 may be provided further inside than the charge generation layer CGL. Accordingly, the first electron transport layer ETL1 and the second hole transport layer HTL2 may have edges identical or similar to that of the hole injection and transport layer 141.

In this case, the electron transport and injection layer 145 includes the second electron transport layer ETL2 and an electron injection layer EIL and is provided in the second stack S2 in terms of electron transport and electron injection.

FIG. 4A shows an interlayer OS having n stacks. When the interlayer OS includes two stacks, the second electron transport layer ETL2 of the electron transport and injection layer 145 may directly contact the electron injection layer EIL under the second electrode 170. In some other aspects, when the interlaver OS includes three or more stacks, the second charge generation layer and other light emitting stacks on the second charge generation layer may be provided on the second electron transport layer ETL2 of the second stack S2, and the electron injection layer EIL and the second electrode 170 may be sequentially formed on the last light emitting stack. Each stack may include at least one emission layer and at least one common laver.

In the light emitting display device according to an aspect of the present disclosure, as illustrated in FIG. 4B, the first connection electrode 121 may be directly connected to the charge generation layer CGL in the charge transport and generation layer 1430. In an aspect shown in FIG. 4B, the n-type charge generation layer 143 and the p-type charge generation layer 144 are connected to different areas of the first connection electrode 121.

That is, unlike the stacked structure of the n-type charge generation layer and the p-type charge generation layer in the display area, the n-type charge generation layer 143 is connected to a first portion of the first connection electrode 121, and the first connection electrode 121 and the p-type charge generation layer 144 are connected at a second portion where the n-type charge generation layer 143 is not formed, as illustrated in FIG. 4B, in the light emitting display device according to an aspect of the present disclosure. This is for the purpose of supplying the reset voltage signal to the p-type charge generation layer 144 as well as the n-type charge generation layer 143 through the first connection electrode 121.

As illustrated in FIG. 3, the n-type charge generation layer nCGL and the p-type charge generation layer pCGL constituting the charge generation layer CGL provided in the charge transport and generation layer 1430 are formed over the entire display area AA and overlap at least the first connection electrode 121 of the non-display area NA. In this case, since the charge generation layer extends to the display area, leaked charges may be accumulated therein due to lateral leakage current caused by adjacent sub-pixels. For example, electrons may be accumulated in the n-type charge generation layer nCGL, and holes may be accumulated in the p-type charge generation layer pCGL. In the light emitting display device according to an aspect of the present disclosure, the n-type charge generation layer (nCGL) 143 formed on the lower side of the structure is selectively formed on the first connection electrode 121 such that the p-type charge generation layer (pCGL) 144 is connected to the first connection electrode 121 in portions where the n-type type charge generation layer (nCGL) 143 is not formed. Therefore, leakage electrons remaining in the n-type charge generation layer (nCGL) 143 may be discharged when a reset voltage is supplied to the first connection electrode 121, and leakage holes remaining in the p-type charge generation layer (pCGL) 144 may be discharged when the reset voltage is supplied to the first connection electrode 121.

Although each of the hole injection and transport layer 141, the charge transport and n-type charge generation layer 143, and the electron transport and injection layer 145 may be formed using an open mask in the light emitting display device according to the first aspect of the present disclosure, the edges of the layers may be positioned at different positions. For example, in the light emitting display device of the present disclosure, the charge generation layer CGL included in the charge transport and n-type charge generation layer 143 is connected to the first connection electrode 121. In addition, the charge generation layer is connected to the first power line 110 under the first connection electrode 121 to periodically receive a reset voltage signal. To this end, the charge generation layer CGL extends from the display area AA and into a part of the non-display area NA to overlap the first connection electrode 121. In addition, as illustrated in FIG. 4B, the n-type charge generation layer (nCGL) 143 is patterned on the first connection electrode 121, and the p-type charge generation layer (pCGL) 144 may be connected to the first connection electrode 121 in a region where the n-type charge generation layer (nCGL) 143 is not present on the first connection electrode 121. The p-type charge generation layer (pCGL) 144 completely overlaps the first connection electrode 121 and may further extend from the edge of the n-type charge generation layer (nCGL) 143.

The edge CGL_EG of the charge generation layer CGL, which includes the n-type charge generation layer nCGL and the p-type charge generation layer pCGL, may be positioned between the first connection electrode 121 and the second connection electrode 122.

In some cases, in the light emitting display according to an aspect of the present disclosure, the edge CGL_EG of the charge generation layer CGL may be positioned outside the edge of the hole injection and transport layer 141 and may have a high resistance when an electrical signal is not directly applied.

In addition, as illustrated in FIG. 3, since the electron transport and injection layer 145 including the electron injection layer EIL provided directly below the second electrode 170 includes the electron injection layer EIL having a small interfacial resistance with respect to the second electrode 170, the edge ETL2_EG of the electron transport and injection layer 145 may be positioned to correspond to the edge CGL_EG of the charge generation layer or positioned outside the edge CGL_EG. In some aspects, the second electron transport layer ETL2 and the electron injection layer EIL of the electron transport and injection layer 145 are involved in electron transport and electron injection and have relatively low resistance among components included in the interlayer OS. In some aspects, even if the second electron transport layer ETL2 and the electron injection layer EIL are located on the charge generation layer CGL and the second electrode 170, the resistance may not increase when the charge generation layer CGL and the second electrode 170 are electrically connected. In some cases, the edge of the second electron transport layer may be positioned inside the edge of the electron injection layer, and only the electron injection layer EIL may be positioned between the charge generation layer CGL and the second electrode 170. In other aspects, the edge ETL2_EG of the second electron transport layer ETL2 may correspond to the edge of the charge generation layer CGL or may be positioned slightly outside the edge of the charge generation layer CGL, and the electron injection layer EIL may have the edge corresponding to the edge of the second electrode 170 (e.g., a cathode) such that the edge of the electron injection layer EIL is positioned outside the edge of the electron transport layer ETL2.

The electron injection layer EIL includes an inorganic compound such as metal or halogen, and even if the electron injection layer EIL is provided between the charge generation layer CGL and the second electrode 170 at the position where the first connection electrode 121 is located, connection resistance may not increase. The electron injection layer EIL may also block outside air or moisture based on a metal or inorganic component contained in the non-display area NA.

In aspects illustrated in FIGS. 2 and 3, the second connection electrode 122 is connected to the second electrode 170 positioned at the top of the light emitting element ED to supply a low-potential voltage, and is positioned outside the first connection electrode 121.

In addition, the edge CAT_EG of the second electrode 170 (e.g., a cathode) is provided outside the edge CGL_EG of the charge generation layer, and is connected to the second connection electrode 122 as illustrated in FIGS. 3 and 4C. The second connection electrode 122 is connected to a second power line 115 (e.g., an auxiliary power line or a common power line) for a low-potential voltage VSS. Accordingly, the second electrode 170) may receive the low-potential voltage VSS through connection of the second connection electrode 122 and the second power line 115.

As illustrated in FIG. 2, the first connection electrode 121 is located in the non-display area NA between the active area and the second connection electrode 122 and may have a closed loop shape. However, in the light emitting display device of the present disclosure, the shape of the first connection electrode 121 is not limited to a closed loop shape. The first connection electrode 121 may have an open loop shape with a discontinuity (e.g., an opening). The first connection electrode 121 is configured to directly receive the reset voltage signal from a power supply located in the non-display area NA or may receive the reset voltage signal through the first power line 110.

As illustrated in FIG. 2, the second connection electrode 122 may also have a closed loop shape. Similarly, in the light emitting display device of the present disclosure, the shape of the second connection electrode 122 is not limited to a closed ring shape and may have a ring shape with a discontinuity (e.g., an opening). In addition, the second electrode 170 may be formed in the entire display area AA and extend to a part of the non-display area NA to be formed on the second connection electrode 122. Since the second connection electrode 122 is located outside the first connection electrode 121, the second electrode 170 may be formed with a larger area than the charge generation layer CGL and located outside the charge generation layer CGL.

In the light emitting display device of the present disclosure, the first connection electrode 121 and the second connection electrode 122 are not necessarily limited to a closed ring shape. The first connection electrode 121 and the second connection electrode 122 may have a ring shape with an opening which allows the potentials of the second electrode 170 and the charge generation layer CGL to be constant.

In some cases, the connection of the first connection electrode 121 and the first power line 110 may occur in a region where the first connection electrode 121 and the first power line 110 partially or completely overlap.

In a tandem device including a plurality of stacks, a charge generation layer may cause lateral leakage current. Positive charges accumulated in a p-type charge generation layer of the upper part of the charge generation layer and cannot pass through a PN junction in the charge generation layer, and thus cannot be discharged through an n-type charge generation layer of the lower part of the charge generation layer. Accordingly, an individual path connected to a reset electrode can be formed to prevent the leakage current.

The influence of charges accumulated in the charge generation layer is considerable, and thus the light emitting display device of the present disclosure improves accumulation of charges in the charge generation layer according to a design of connection with an electrode by which the potential of the charge generation layer may be reset.

In some cases, an area in which the n-type charge generation layer is formed is separated from an area in which the p-type charge generation layer is formed such that each layer may be connected to a reset electrode of the charge generation layer. In this case, the effect of discharging charges that cause leakage current increases.

Negative charges are accumulated in the n-type charge generation layer of the charge generation layer, positive charges are accumulated in the p-type charge generation layer, and the positive charges cannot pass through the PN junction, and an individual path can be formed to reduce leakage current. In some aspects, the light emitting display device separates the areas in which the n-type charge generation layer and the p-type charge generation layer are formed and provides individual reset electrodes to discharge leaked charges in the charge generation layer, preventing generation of lateral leakage current and improving light emission efficiency.

Components that have not been described in the configuration of FIG. 2 will be described.

In each of the sub-pixels G_SP, B_SP, and R_SP, the first electrode 120 of the light emitting element ED is connected to a thin film transistor TFT. For example, as illustrated in FIG. 3, the thin film transistor TFT includes a semiconductor layer 103, a gate electrode 105 overlapping a channel of the semiconductor layer 103 having a gate insulating layer 104 interposed therebetween, a source electrode 106 and a drain electrode 107 connected to the semiconductor layer 103.

The source electrode 106 or the drain electrode 107 of the semiconductor layer 103 may be connected to the first electrode 120 of the light emitting element.

Non-limiting examples of a semiconductor layer 103 may include at least one of an oxide semiconductor, amorphous silicon, and crystalline silicon.

A light shielding layer 101 may be further provided below the semiconductor layer 103 to prevent light entering the lower side of the substrate 100 and affecting the semiconductor layer 103.

A buffer layer 102 may be further provided between the light shielding layer 101 and the semiconductor layer 103. The buffer layer 102 may be formed on the entire surface of the substrate 100 to prevent impurities in the substrate 100 from penetrating into the upper structure.

An inorganic passivation layer 108 and a planarization layer 109 may be sequentially formed to protect the thin film transistor TFT.

The buffer layer 102 and the inorganic passivation layer 108 may be, for example, any one of a silicon oxide layer, a silicon nitride layer, a silicon oxynitride layer, a metal oxide layer, and a metal nitride layer.

The planarization layer 109 may be formed of at least one of organic materials such as photo acryl, polyimide, a benzocyclobutene resin, and acrylate.

The first connection electrode 121 and the second connection electrode 122 may be formed of the same material on the same layer as the first electrode 120. In one example, the first connection electrode 121 for connection to the charge generation layer CGL may be formed while forming the first electrode 120. The first connection electrode 121, the second connection electrode 122, and the first electrode 120 may all be positioned on the planarization layer 109.

Aspects of a voltage variation in a charge generation layer node in a first experimental example described with reference to FIG. 4B. In this first experiment, the n-type charge generation layer and a p-type charge generation layer are laminated on the first connection electrode 121. In a second experimental example, the n-type charge generation layer 143 and the p-type charge generation layer 144 are connected to different connection portions of the first connection electrode 121. The first and second experiments will be further describe d with reference to timing diagrams illustrated in FIGS. 5A and 5B.

Figure 5A:
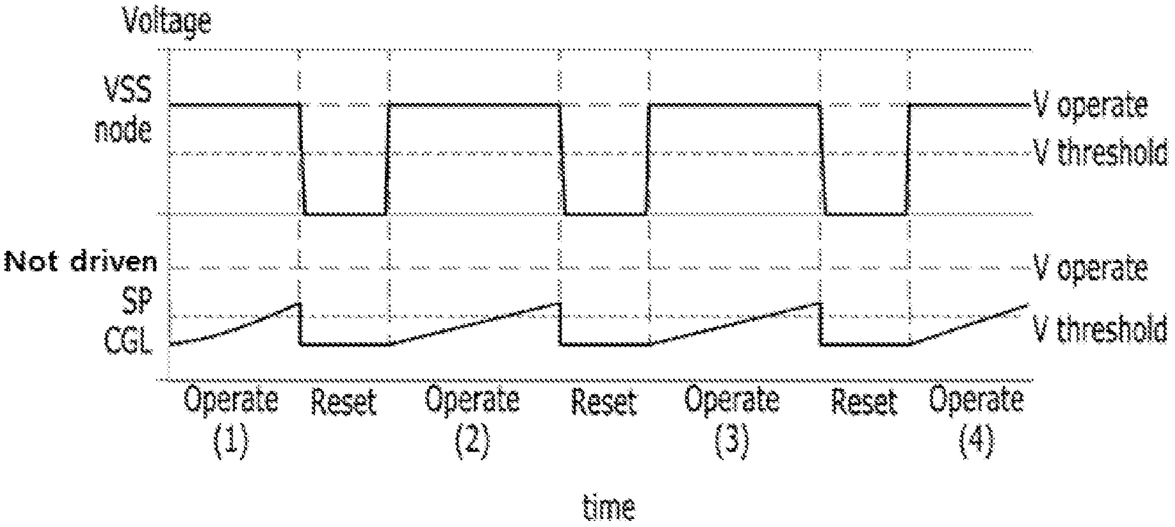
FIGS. 5A and 5B are timing diagrams showing potentials of a node of a second electrode and a node of a charge generation layer of a sub-pixel that is not driven in light emitting display devices of first and second experimental examples of the present disclosure.
Figure 5B:
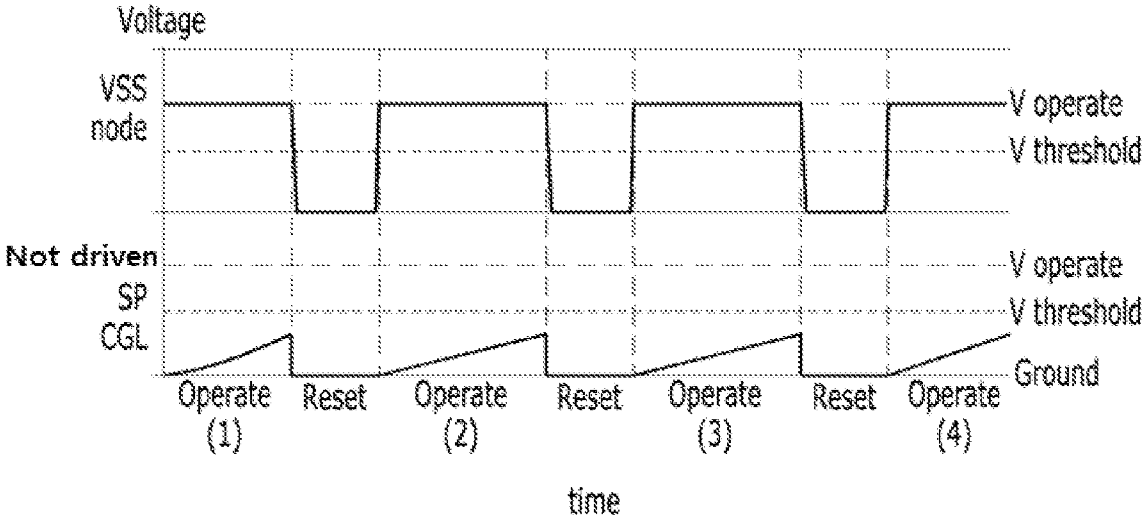

FIGS. 5A and 5B are timing diagrams showing potentials of the node of the second electrode and the node of the charge generation layer of a sub-pixel that is not driven in the light emitting display devices of the first and second experimental examples of the present disclosure.

As illustrated in FIG. 5A, in the first experimental example in which the n-type charge generation layer and the p-type charge generation layer are laminated on the first connection electrode 121, and only the n-type charge generation layer is connected to the first connection electrode. In this case, a PN junction occurs between the p-type charge generation layer and the n-type charge generation layer, and the p-type charge generation layer is physically separated from the first connection electrode 121. Since the p-type charge generation layer is commonly formed in the display area, when a specific sub-pixel is driven, holes are continuously accumulated in the p-type charge generation layer in a sub-pixel that is not driven adjacent to the specific sub-pixel due to the influence of lateral leakage current from the specific sub-pixel, causing the potential of the charge generation layer node to increase, and in severe cases, causing the potential to exceed a threshold voltage Vthreshold (which causes the pixel to emit light).

In the light emitting display device of the present disclosure, the charge generation layer is connected to the first connection electrode 121 and thus may be reset when a reset voltage signal is supplied to the charge generation layer through the first connection electrode 121. In this case, leaked charges cannot be completely discharged even when the reset voltage is supplied due to the amount of charges accumulated in the p-type charge generation layer, and thus the node potential of the charge generation layer may be a positive potential.

On the other hand, in the second experimental example in which the n-type charge generation layer 143 and the p-type charge generation layer 144 are respectively connected to different connection portions of the first connection electrode 121, as illustrated in FIG. 4B, the p-type charge generation layer 144 as well as the n-type charge generation layer 143 are connected to the first connection electrode 121. When the reset voltage signal is supplied, charges may be discharged from the p-type charge generation layer 144 and the n-type charge generation layer 143. Therefore, whenever the reset voltage signal is supplied to the first connection electrode 121, both the node potentials of the n-type charge generation layer 143 and the p-type charge generation layer 144 connected to the first connection electrode 121 may be coupled to a ground voltage. Therefore, even if charge accumulation occurs at the charge generation layer node at the ground voltage due to leakage current generated based on operation of an adjacent sub-pixel, the node voltage of the charge generation layer that has increased due to the accumulated charges does not exceed the threshold voltage. Accordingly, when a structure in which the n-type charge generation layer and the p-type charge generation layer are connected to different connection portions of the first connection electrode, as illustrated in FIG. 4B, both positive leaked charge and negative leaked charge may be effectively discharged based on the reset voltage signal. the node voltage of the charge generation layer does not exceed the threshold voltage in a sub-pixel that is not driven when an adjacent sub-pixel is driven, color leakage due to leaked charges does not occur.

Meanwhile, the node VSS illustrated in FIGS. 5A and 5B indicates the node potential of the second electrode and represents that, when the reset voltage is supplied to the n-type charge generation layer 143 or the p-type charge generation layer 144 through the first connection electrode 121, the voltage of the second electrode 170 also drops to the ground voltage of the reset voltage signal since the second electrode 170 is positioned on the n-type charge generation layer 143 or the p-type charge generation layer 144, as illustrated in FIG. 4B.

In some aspects, the reset voltage signal may be applied when the light emitting element is not driven.

Hereinafter, a light emitting display device according to an aspect of the present disclosure will be described in more detail.

Figure 6:
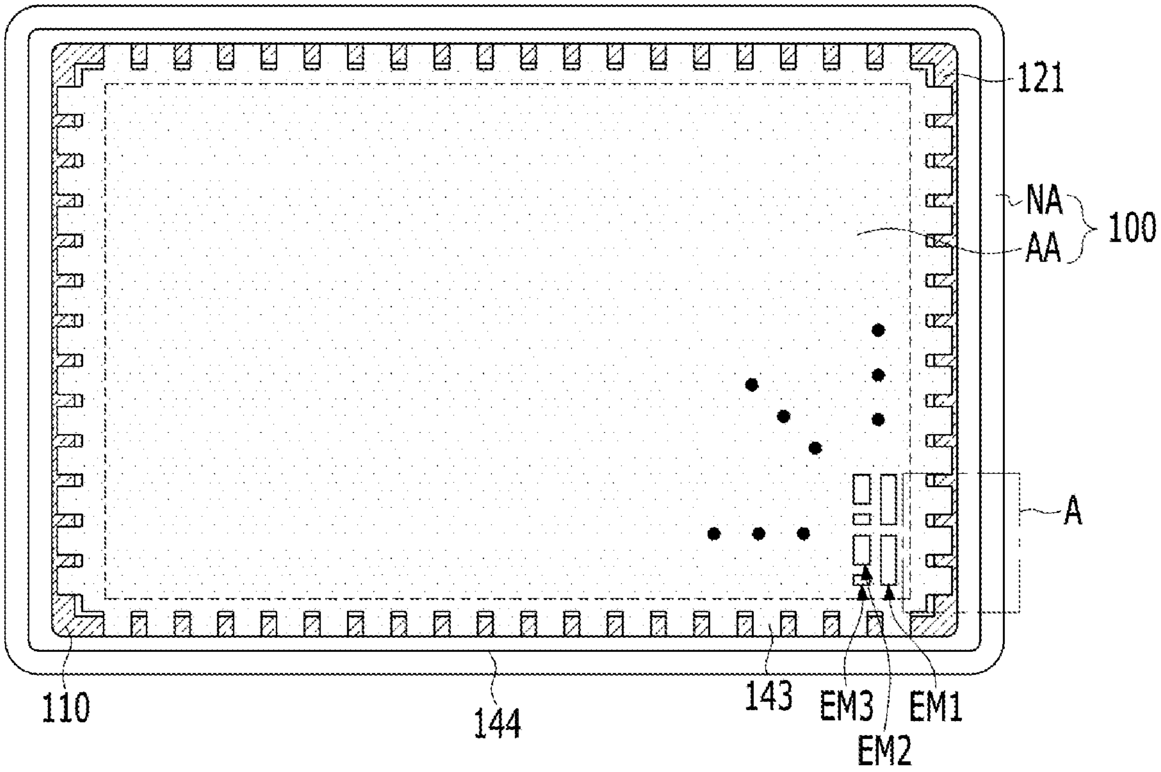
FIG. 6 is a plan view illustrating the light emitting display device according to an aspect of the present disclosure.
Figure 7:
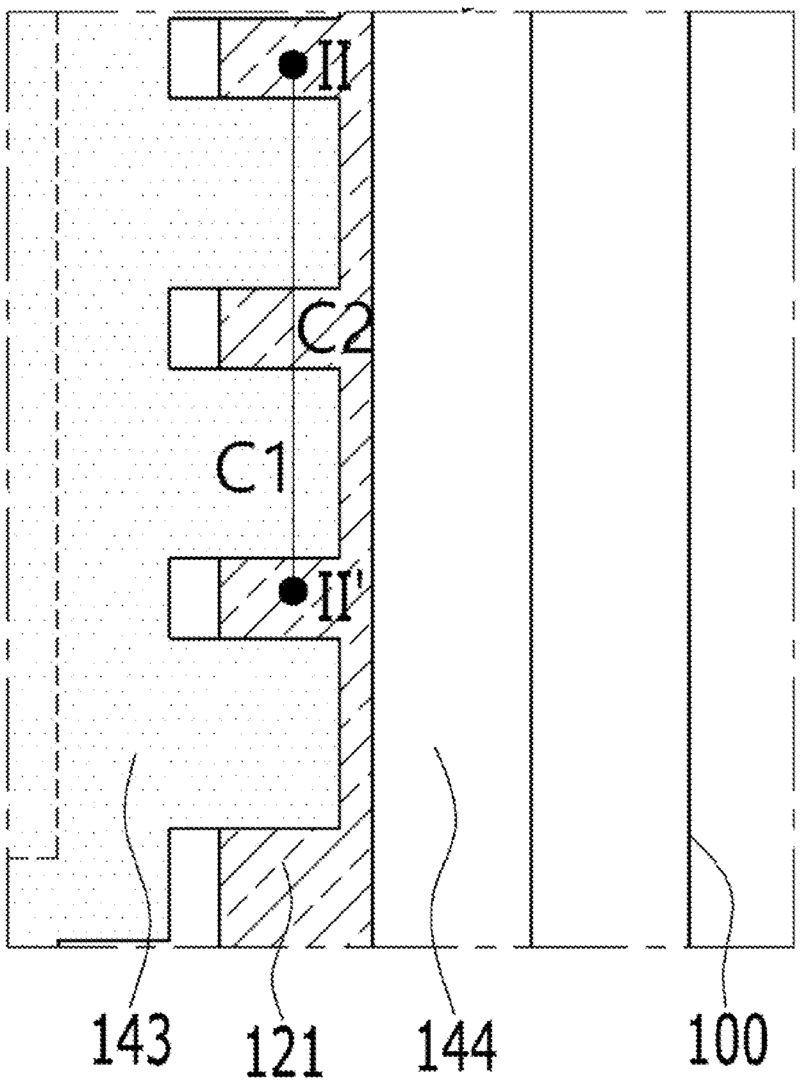
FIG. 7 is an enlarged view of area A of FIG. 6.
Figure 8:
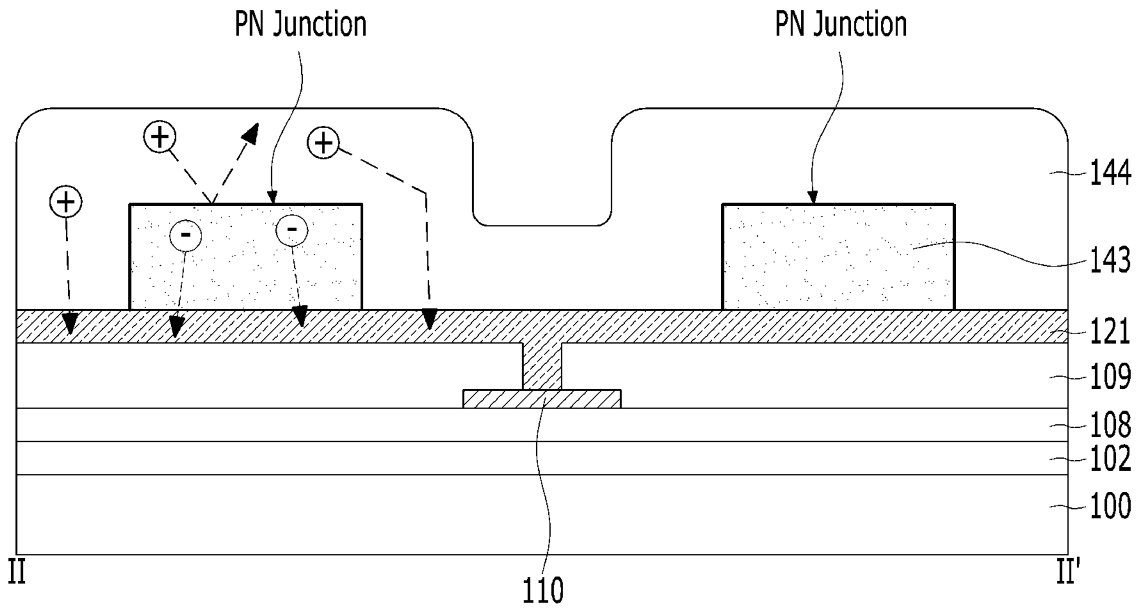
FIG. 8 is a cross-sectional view taken along line II-II' of FIG. 7.

FIG. 6 is a plan view illustrating the light emitting display device according to an aspect of the present disclosure. FIG. 7 is an enlarged view of area A of FIG. 6. FIG. 8 is a cross-sectional view taken along line II-II' of FIG. 7.

As illustrated in FIGS. 6 to 8, the light emitting display device according to an aspect of the present disclosure may include the substrate 100 including the display area AA including a plurality of sub-pixels EM1, EM2, and EM3 and the non-display area NA surrounding the display area AA, a plurality of first electrodes 120 provided in the plurality of sub-pixels EM1, EM2, and EM3, the second electrode 170 facing the plurality of first electrodes 120 and extending over the entire area AA and a part of the non-display area, a plurality of stacks (e.g., S1 and S2 in FIG. 4A) provided between the plurality of first electrodes and the second electrode, an interlayer (e.g., interlayer OS in FIG. 4A) including a charge generation layer (e.g., charge generation layer CGL in FIGS. 4A and 4B) between the plurality of stacks, and the first connection electrode 121 connected to the charge generation layer CGL. The charge generation layer CGL may include the n-type charge generation layer 143 and the p-type charge generation layer 144, and the n-type charge generation layer 143 and the p-type charge generation layer 144 may have a first connection part C1 and a second connection part C2 in different regions of the first connection electrode 121.

The first connection electrode 121 is provided in the non-display area NA along the outer circumference of the display area AA, and a reset voltage signal may be applied to the first connection electrode 121 as illustrated in FIG. 5B.

As illustrated in FIG. 7, the first connection part C1 and the second connection part C2 may be alternately disposed in the direction in which the first connection electrode 121 extends.

The n-type charge generation layer 143 is in contact with the first connection electrode 121 over the entire region where the n-type charge generation layer 143 overlaps the first connection electrode 121. In addition, the p-type charge generation layer 144 may contact with the first connection electrode 121 in regions other than regions where the n-type charge generation layer 143 overlaps the first connection electrode 121. That is, the p-type charge generation layer 144 may contact with the first connection electrode 121 at the first connection parts C1.

The n-type charge generation layer 143 overlaps the first connection electrode 121 only at the first connection parts C1, and the p-type charge generation layer 144 overlaps the entire first connection electrode 121.

As illustrated in FIGS. 6 and 7, the edge of the n-type charge generation layer 143 may have a shape in which protruding portions and non-protruding portions are alternately formed on a plane. Although the first connection parts C1 have a rectangular shape in FIGS. 6 and 8, the light emitting display device of the present disclosure is not limited thereto. The first connection parts C1 may have a polygonal shape, a rectangular shape, a circular shape, an elliptical shape, or a shape with a straight-line portion and a curved portion. In any case, in the light emitting display device according to an aspect of the present disclosure, the second connection parts C2 are provided on the first connection electrode 121 in addition to the first connection parts C1 to secure regions where the p-type charge generation layer 144 is connected to the first connection electrode 121 such that the reset voltage signal may also be applied to the p-type charge generation layer 144.

The n-type charge generation layer 143 may be in contact with the first connection electrode 121 at the protruding portions of the n-type charge generation layer 143 which protrude toward the first connection electrode 121, and the p-type charge generation layer 144 may be in contact with the first connection electrode 121 at the non-protruding portions.

As illustrated in FIGS. 6 and 7, the p-type charge generation layer 144 is located outside the n-type charge generation layer 143, and the p-type charge generation layer 144 may secure a sufficient region for connection with the first connection electrode 121 in an area where the n-type charge generation layer 143 is not positioned.

As illustrated in FIG. 4A, the n-type charge generation layer 143 and the p-type charge generation layer 144 are sequentially laminated in the display area AA. Further, the n-type charge generation layer 143 may contact the first stack S1 disposed therebelow and the p-type charge generation layer 144 may contact the second stack S2 disposed thereon. For example, the n-type charge generation layer 143 may contact the first electron transport layer ETL1, and the p-type charge generation layer 144 may contact the second hole transport layer HTL2.

When the reset voltage signal is applied to the first connection electrode 121, the n-type charge generation layer 143 and the p-type charge generation layer 144 are electrically connected to the first connection electrode 121, and thus the n-type charge generation layer 143 and the p-type charge generation layer 144 may be reset together, as illustrated in FIG. 8.

In addition, as illustrated in FIGS. 4C and 5B, when the reset voltage signal is applied to the first connection electrode 121, the potentials of the n-type charge generation layer 143 and the p-type charge generation layer 144 drop to the ground voltage, and thus the second electrode 170 connected in series may also be reset.

In the light emitting display device of the present disclosure, both the n-type charge generation layer (nCGL) 143 and the p-type charge generation layer (pCGL) 144 are connected to the first connection electrode 121. When the reset voltage signal is supplied to the first connection electrode 121, and the n-type charge generation layer (nCGL) 143 and the p-type charge generation layer (pCGL) 144 may be periodically reset to the ground potential level. The node potentials of the n-type charge generation layer (nCGL) 143 and the p-type charge generation layer (pCGL) 144 are reset, and charges accumulated in the n-type charge generation layer (nCGL) 143 and the p-type charge generation layer (pCGL) 144 may be discharged. The leakage current is not generated and operation of adjacent sub-pixels may be prevented, increasing the quality of the displayed image.

In some aspects, the principle of the light emitting display device according to the present disclosure will be described with reference to FIG. 8.

In the light emitting display device of the present disclosure, the n-type charge generation layer 143 is formed with a partial connection part on the first connection electrode 121.

A PN junction is generated at the interface where the n-type charge generation layer 143 and the p-type charge generation layer 144 meet, and leakage charges cannot not pass through the PN junction based on a barrier voltage formed at this interface. Therefore, if the n-type charge generation layer and the p-type charge generation layer have a layered structure in the entire area, the first connection electrode contacts only the n-type charge generation layer and is not connected to the p-type charge generation layer. In this case, when the reset voltage signal is applied to the first connection electrode, positive charges accumulated in the p-type charge generation layer may not be discharged because leakage current in the p-type charge generation layer is repelled at the PN junction.

In the present disclosure, the n-type charge generation layer 143 is in contact with the first connection electrode 121 only at the first connection parts C1, and the p-type charge generation layer 144 directly contacts the first connection electrode 121 at regions where first connection electrode 121 and the n-type charge generation layer 143 are not connected, and thus positive charges may be discharged through the first connection electrode 121.

Therefore, both the n-type charge generation layer 143 and the p-type charge generation layer 144 are in contact with the first connection electrode 121, and when the reset voltage signal is applied, negative charge and positive charge accumulated in the n-type charge generation layer 143 and the p-type charge generation layer 144 may be discharged through the first connection electrode 121.

The first connection electrode 121 may be connected to the first power line 110 formed in a thin film transistor array process. The first power line 110 may be optional. The first power line 110 and/or the first connection electrode 121 may be connected to the power supply to receive the reset voltage signal. If the first power line 110 is omitted, the first connection electrode 121 may be directly connected to the power supply.

In the light emitting display device of the present disclosure, the first connection electrode 121 and the second connection electrode 122 may be formed of the same material on the same layer as the first electrode 120 (e.g., an anode), thereby ensuring material stability for light emitting elements. Accordingly, it is possible to prevent generation of harmful substances and prevent defects caused thereby. Therefore, it is possible to obtain Environmental/Social/Governance (ESG) effects in terms of eco-friendliness, low power consumption, and process optimization.

Hereinafter, a method of manufacturing the light emitting display device according to an aspect of the present disclosure will be described.

Figure 9:
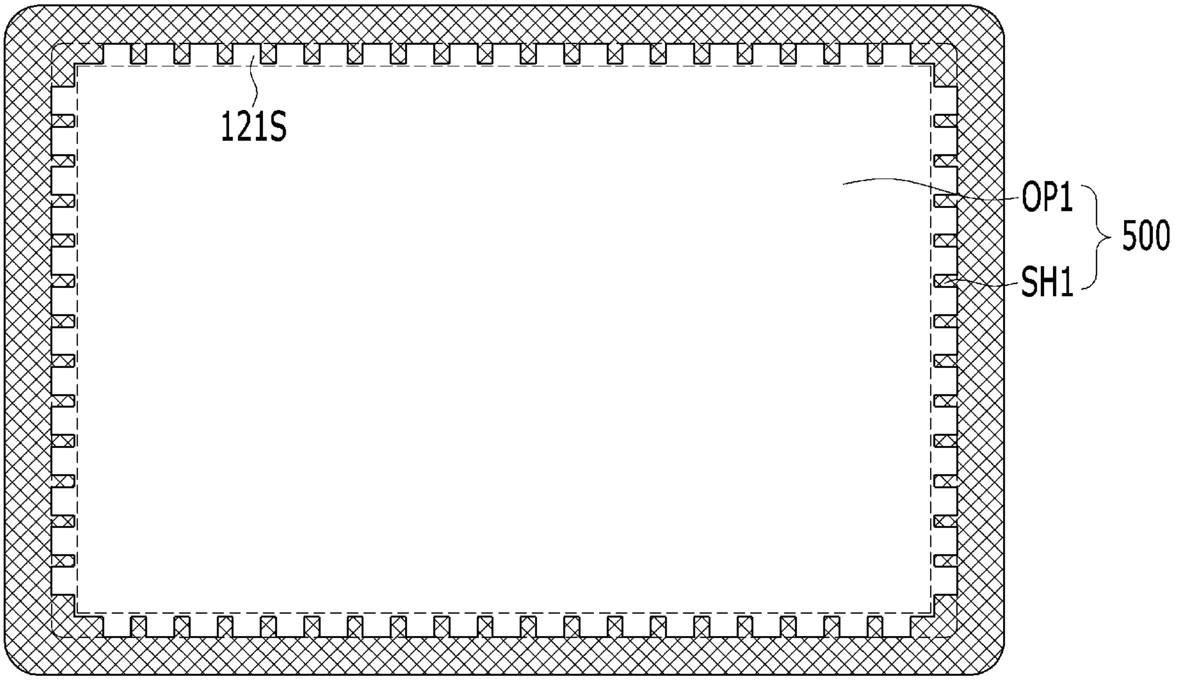
FIG. 9 is a plan view illustrating a first mask for forming an n-type charge generation layer of the light emitting display device according to the present disclosure.
Figure 10:
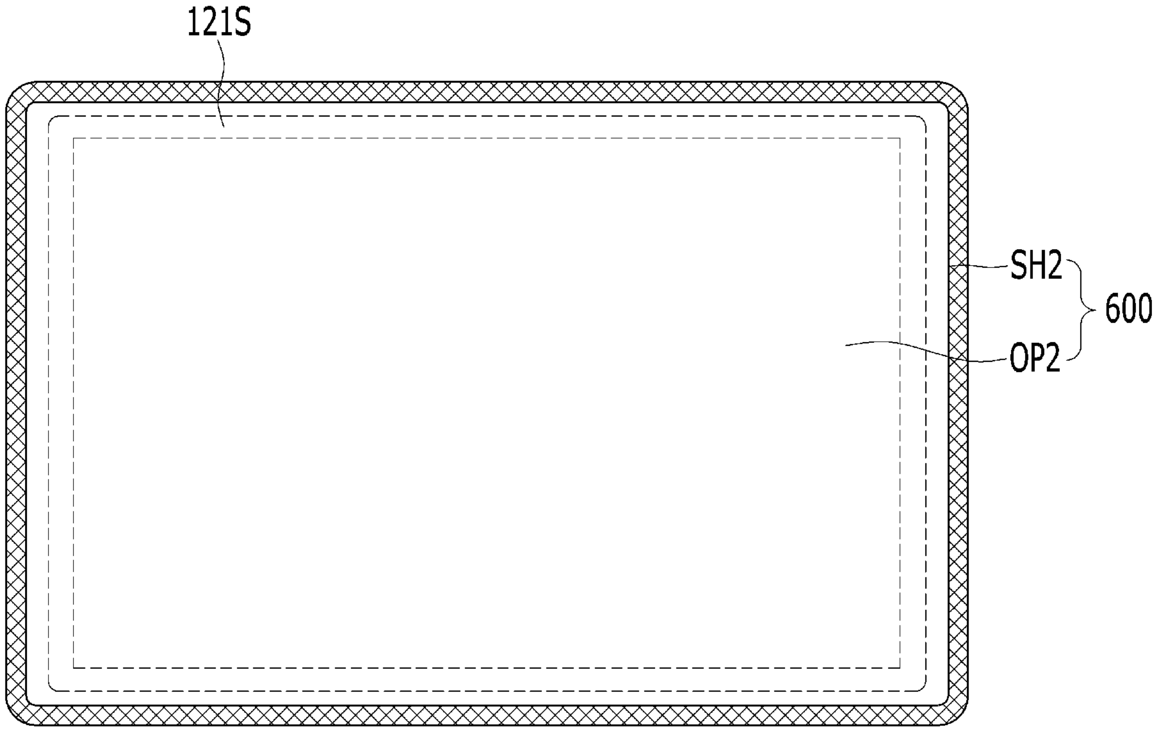
FIG. 10 is a plan view illustrating a second mask for forming a p-type charge generation layer of the light emitting display device according to the present disclosure.
Figure 11A:
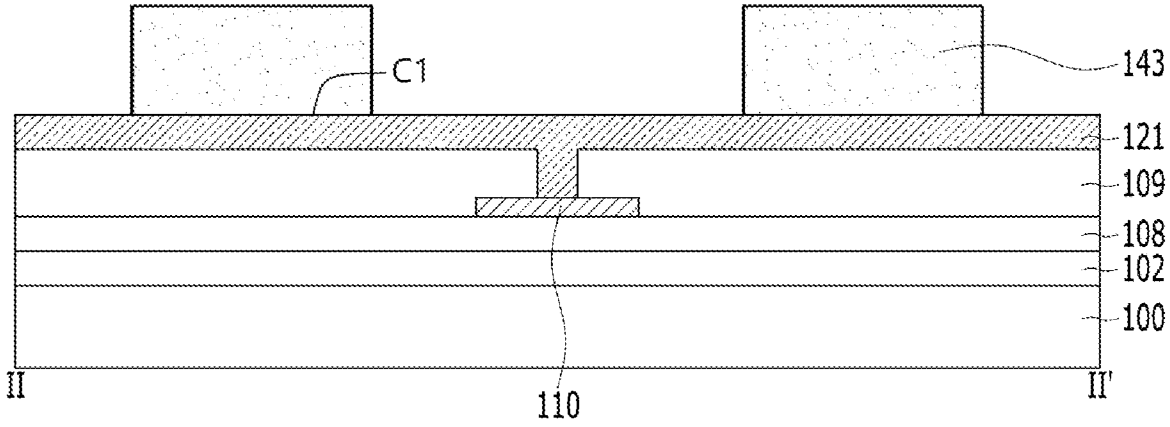
FIGS. 11A and 11B are cross-sectional views illustrating a method of manufacturing the light emitting display device according to the present disclosure.
Figure 11B:
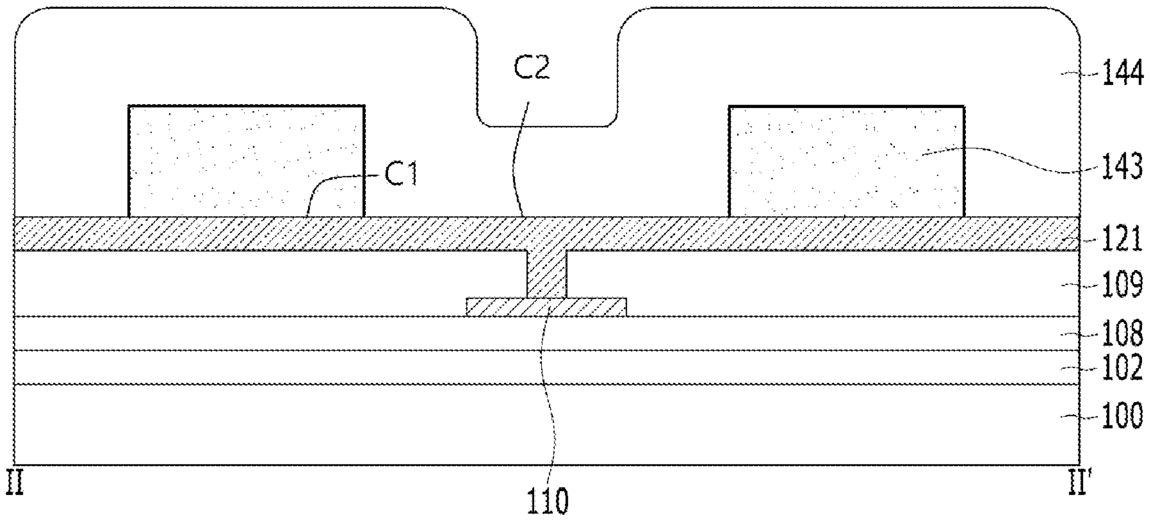

FIG. 9 is a plan view illustrating a first mask for forming the n-type charge generation layer of the light emitting display device according to an aspect of the present disclosure. FIG. 10 is a plan view illustrating a second mask for forming the p-type charge generation layer of the light emitting display device according to an aspect of the present disclosure. FIGS. 11A and 11B are cross-sectional views illustrating a method of manufacturing the light emitting display device according to the present disclosure.

As illustrated in FIG. 4A, the first stack S1 including the hole injection layer HIL, the first hole transport layer HTL1, the first emission layer EML (151, 152, and 153), and the first electron transport layer ETL1 is formed on the plurality of first electrodes 120. The hole injection layer HIL, the first hole transport layer HTL1, and the first electron transport layer ETL1 may also be continuous on a first bank 130*a* as well as the first electrode 120, and may be continuous on a second bank 130*b* provided in the non-display area NA.

Subsequently, as illustrated in FIG. 9, the first mask 500 having a first opening OP1 corresponding to the entire display area and a first connection electrode formation part 121S, and a first light shielding part SH1 in the remaining area is formed.

The n-type charge generation layer 143 is formed on the first electron transport layer ETL1 through the first opening OP1 of the first mask 500. Here, since the n-type charge generation layer 143 is formed through the first opening OP1 overlapping the first connection electrode formation part 121S in the non-display area NA, the n-type charge generation layer 143 including the first connection parts C1 partially overlaps the first connection electrode 121 and is connected to the first connection electrode 121 through the overlapping first connection parts C1, as illustrated in FIG. 11A.

Subsequently, as illustrated in FIG. 10, the second mask 600 having a second opening OP2 corresponding to the entire display area AA and a part of the non-display area NA beyond the first connection electrode formation part 121S, and a second light shielding part SH2 corresponding to the edge of the non-display area NA is formed.

As illustrated in FIG. 11B, the p-type charge generation layer 144 is formed on the first electron transport layer ETL1 through the second opening OP2 of the second mask 600. Here, since the p-type charge generation layer 144 is formed through the second opening OP2 completely overlapping the first connection electrode formation part 121S, it has a region completely overlapping the first connection electrode 121 and is directly connected to the first connection electrode 121 at the second connection parts C2 other than the n-type charge generation layer 143 connected through the first connection parts C1.

Subsequently, after the p-type charge generation layer 144 is formed, the second stack S2 is formed, and as illustrated in FIG. 3, the second electrode 170 is formed to extend to the outside from the p-type charge generation layer 144 to be connected to the second connection electrode 122 while overlapping the second connection electrode 122.

The light emitting display device of the present disclosure may discharge stored charges in a charge generation layer during a non-display interval and prevent formation of a lateral leakage current that causes an adjacent pixel emit light.

In addition, in the structure of the charge generation layer including an n-type charge generation layer and a p-type charge generation layer to generate and supply electrons and holes to adjacent light emitting stacks in the light emitting display device of the present disclosure, the structure of the n-type charge generation layer is modified such that both the n-type charge generation layer and the p-type charge generation layer are connected to the connection electrode to which the reset voltage signal is applied to form paths through charges are discharged from both the charge generation layers of different polarities, effectively preventing leakage current occurring in the charge generation layer.

The light emitting display device of the present disclosure has the following effects.

First, it is possible to solve the problem caused by lateral leakage current by providing a path through which leaked charge may be discharged from a charge generation layer having high mobility in a tandem device including a plurality of stacks.

Second, in the structure of the charge generation layer including the n-type charge generation layer and the p-type charge generation layer to generate and supply electrons and holes to adjacent light emitting stacks, the structure of the n-type charge generation layer is changed such that both the n-type charge generation layer and the p-type charge generation layer are connected to the connection electrode to which the reset voltage signal is applied, to form paths through which leaked charges may be discharged in both the charge generation layers of different polarities, effectively preventing leakage current in the charge generation layer.

Third, the connection electrode (line) provided in the non-display area is connected to the n-type charge generation layer and the p-type charge generation layer, and the structure in which the n-type charge generation layer and the p-type charge generation layer are laminated is maintained in the display area. In this light emitting display device, light emission occurs according to generation of vertical electric fields when sub-pixels are driven without supply of the reset voltage signal to the connection electrode when the light emitting display device is operated, and the reset voltage signal is supplied to the connection electrode periodically or when the display device is not operated such that charges leaked to the p-type charge generation layer and the n-type charge generation layer are discharged through the connection electrode. Accordingly, it is possible to prevent the influence of lateral leakage current and to prevent color leakage caused by operation of adjacent sub-pixels due to the lateral leakage current.

Fourth, in the light emitting display device of the present disclosure, a region in which no PN junction occurs on the connection electrode (connection line) is secured by changing the structures of the n-type charge generation layer and the p-type charge generation layer, and thus there is no need to add materials to achieve the structures and the structures may be obtained by adjusting the mask for the n-type charge generation layer. Therefore, it is possible to prevent generation of harmful substances and prevent defects caused thereby. Accordingly, it is possible to obtain ESG effects in terms of eco-friendliness, low power consumption, and process optimization.

A light emitting display device according to one or more aspects of the present disclosure may comprise a substrate including a display area having a plurality of sub-pixels and a non-display area surrounding the display area, a plurality of first electrodes at the plurality of sub-pixels, a second electrode facing the plurality of first electrodes and extending over the entire display area and a part of the non-display area, an interlayer including a plurality of stacks between the plurality of first electrodes and the second electrode and a charge generation layer between the plurality of stacks and a connection electrode connected to the charge generation layer. The charge generation layer may include an n-type charge generation layer and a p-type charge generation layer. The n-type charge generation layer and the p-type charge generation layer may respectively have a first connection part and a second connection part for connection with the connection electrode.

In a light emitting display device according to one or more aspects of the present disclosure, the connection electrode may be provided at the non-display area along an outer circumference of the display area, and a reset voltage signal may be applied to the connection electrode.

In a light emitting display device according to one or more aspects of the present disclosure, the first connection part and the second connection part may be alternately provided in a direction in which the connection electrode extends.

In a light emitting display device according to one or more aspects of the present disclosure, the n-type charge generation layer may be in contact with an entire region overlapping the connection electrode, and the p-type charge generation layer is in contact with the connection electrode in a region other than the region where the n-type charge generation layer overlaps the connection electrode.

In a light emitting display device according to one or more aspects of the present disclosure, the n-type charge generation layer may overlap the connection electrode only at the first connection part, and the p-type charge generation layer overlaps an entire of the connection electrode.

In a light emitting display device according to one or more aspects of the present disclosure, an edge of the n-type charge generation layer may have a shape in which protruding portions and non-protruding portions are alternate on a plane.

In a light emitting display device according to one or more aspects of the present disclosure, the n-type charge generation layer may contact the connection electrode at the protruding portions, and the p-type charge generation layer may contact the connection electrode at the non-protruding portions.

In a light emitting display device according to one or more aspects of the present disclosure, the p-type charge generation layer may be positioned outside the n-type charge generation layer.

In a light emitting display device according to one or more aspects of the present disclosure, the n-type charge generation layer and the p-type charge generation layer may be sequentially stacked at the display area, and the n-type charge generation layer and the p-type charge generation layer may be in contact with different stacks.

A light emitting display device according to one or more aspects of the present disclosure may further comprise a power line connected to the second electrode. The power line may be positioned outside the connection electrode.

In a light emitting display device according to one or more aspects of the present disclosure, both the n-type charge generation layer and the p-type charge generation layer may be reset when the reset voltage signal is applied to the connection electrode.

In a light emitting display device according to one or more aspects of the present disclosure, the second electrode may be reset when the reset voltage signal is applied to the connection electrode.

It will be apparent to those skilled in the art that various modifications and variations may be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display device comprising:

a substrate including a display area having a plurality of sub-pixels and a non-display area surrounding the display area;

a plurality of first electrodes at the plurality of sub-pixels;

a second electrode facing the plurality of first electrodes and extending over an entire display area and a part of the non-display area;

an interlayer including a plurality of stacks between the plurality of first electrodes and the second electrode and a charge generation layer between the plurality of stacks; and a connection electrode connected to the charge generation layer, wherein the charge generation layer includes an n-type charge generation layer and a p-type charge generation layer, and the n-type charge generation layer includes a first connection part connected to the connection electrode and the p-type charge generation layer includes a second connection part connected to the connection electrode, wherein the n-type charge generation layer overlaps the connection electrode only at the first connection part, and wherein the p-type charge generation layer overlaps an entire entirety of the connection electrode.

2. The light emitting display device of claim 1, wherein the connection electrode is provided at the non-display area along an outer circumference of the display area, and is configured for a reset voltage signal to be applied to the connection electrode.

3. The light emitting display device of claim 2, wherein the n-type charge generation layer and the p-type charge generation layer are sequentially stacked at the display area, and the n-type charge generation layer and the p-type charge generation layer are in contact with different stacks.

4. The light emitting display device of claim 2, further comprising a power line connected to the second electrode, wherein the power line is positioned outside the connection electrode.

5. The light emitting display device of claim 2, wherein the device is configured for both the n-type charge generation layer and the p-type charge generation layer to be reset when the reset voltage signal is applied to the connection electrode.

6. The light emitting display device of claim 2, wherein the device is configured for the second electrode to be reset when the reset voltage signal is applied to the connection electrode.

7. The light emitting display device of claim 1, wherein the first connection part and the second connection part are alternately provided in a direction in which the connection electrode extends.

8. The light emitting display device of claim 1, wherein the n-type charge generation layer contacts a first region overlapping the connection electrode, and the p-type charge generation layer contacts the connection electrode in a second region different from the first region.

9. The light emitting display device of claim 1, wherein the p-type charge generation layer is positioned outside the n-type charge generation layer.

10. The light emitting display device of claim 1, wherein the device is configured to discharge the n-type charge generation layer and the p-type charge generation layer when a low voltage is applied to the connection electrode during a non-display period associated with each pixel.

11. The light emitting display device of claim 10, wherein the device is configured for the low voltage to decrease charges at a PN junction formed by the n-type charge generation layer and the p-type charge generation layer.

12. A light emitting display device comprising:

a substrate including a display area having a plurality of sub-pixels and a non-display area surrounding the display area;

a plurality of first electrodes at the plurality of sub-pixels;

a second electrode facing the plurality of first electrodes and extending over an entire display area and a part of the non-display area;

an interlayer including a plurality of stacks between the plurality of first electrodes and the second electrode and a charge generation layer between the plurality of stacks; and a connection electrode connected to the charge generation layer, wherein the charge generation layer includes an n-type charge generation layer and a p-type charge generation layer, and the n-type charge generation layer includes a first connection part connected to the connection electrode and the p-type charge generation layer includes a second connection part connected to the connection electrode, wherein an edge of the n-type charge generation layer comprises alternately protruding portions and non-protruding portions on a plane.

13. The light emitting display device of claim 12, wherein the n-type charge generation layer contacts the connection electrode at the protruding portions, and the p-type charge generation layer contacts the connection electrode at the non-protruding portions.

14. A method of forming a light emitting display device, comprising:

depositing a first electrode layer on a surface of a substrate;

forming a first mask on the first electrode layer, the first mask having a first opening corresponding to an active area and having interleaved portions that extend into a non-active area;

depositing a first charge generation layer to selectively contact the first electrode layer at the interleaved portions based on the first mask;

forming a second mask having a second opening that encompasses an entire surface of the first charge generation layer; and depositing a second change generation layer to selectively contact the first electrode layer based on the second mask and the first change generation layer, wherein a connection electrode is formed on a same layer as the first electrode layer when forming the first electrode layer, wherein the first charge generation layer is formed as an n-type charge generation layer that overlaps the connection electrode only at a first connection part, and wherein the second charge generation layer is formed as a p-type charge generation layer that overlaps an entire surface of the connection electrode.

* * * * *